Feb. 28, 1967 E. J. WILLIAMS 3,307,117

HIGH FREQUENCY GENERATOR EMPLOYING STEP RECOVERY DIODE

Filed Oct. 29, 1964

INVENTOR.
ERNEST J. WILLIAMS

BY

Flehr and Swain
ATTORNEYS

United States Patent Office 3,307,117

Patented Feb. 28, 1967

3,307,117

HIGH FREQUENCY GENERATOR EMPLOYING STEP RECOVERY DIODE

Ernest John Williams, Mountain View, Calif., assignor, by mesne assignments, to International Telephone and Telegraph Corporation, a corporation of Maryland Filed Oct. 29, 1964, Ser. No. 407,364
3 Claims. (Cl. 331—42)

Figures 1, 2:
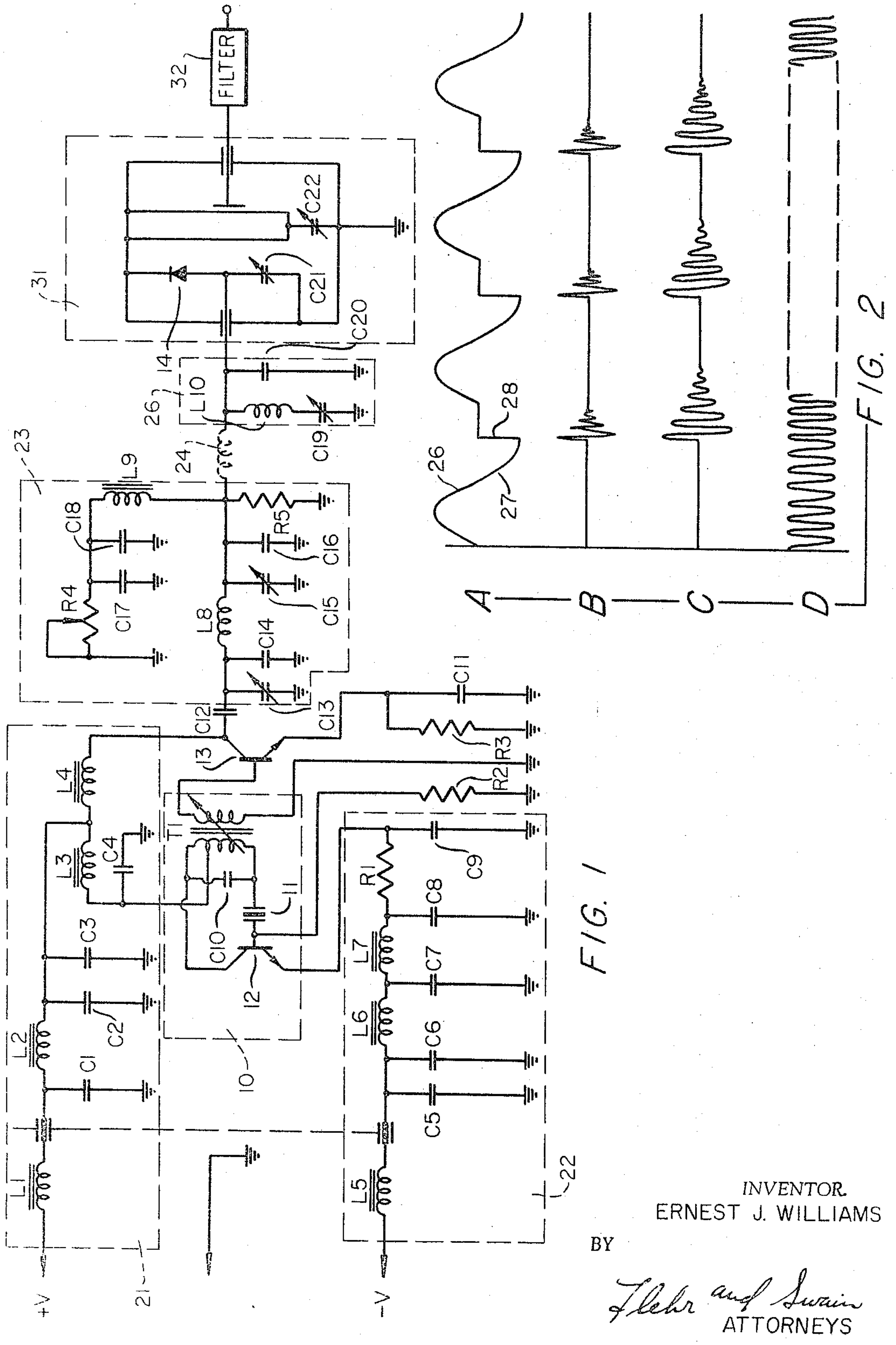

This invention relates generally to a high frequency generator and more particularly to a high frequency generator employing step recovery diodes.

The use of step recovery diodes to generate high frequencies is well known. For this purpose, the diode is driven from a high frequency alternating voltage source. The diode conducts when the applied voltage is in the forward direction. When the voltage is reversed, the diode continues to conduct until the space charge region is depleted. The diode then turns off abruptly. A fourier analysis of the waveform generated at turn-off shows that there are present a number of harmonics. By connecting a suitable tuned circuit across the diode, it is possible to tune the circuit to one of the higher harmonics to obtain an output frequency at a frequency considerably higher than the driving frequency.

Frequency multiplication and conversion has been effected by varacters, diodes in which the capacity of the junction is varied by applying a reverse voltage to the diode. Generally, the variation of the capacity is non-linear and varactors have found wide application as frequency converters and frequency multipliers.

In accordance with the present invention, it has been discovered that a step recovery diode operates as a varactor when it is in its "off" state. Thus, the step recovery diode is used to generate harmonics of a driving frequency. A storage or tank circuit is connected to resonate at one of the harmonics. When the diode is turned off, there is mixing of the generated harmonics with the storage frequency, and a much higher frequency is generated due to the non-linear capacitance of the diode. A tuned circuit provides the higher frequency output.

It is a general object of the present invention to provide a microwave frequency generator employing step recovery diodes.

It is another object of the present invention to provide a microwave frequency generator which is simple in construction and efficient in operation.

The foregoing and other objects of the invention will become more clearly apparent with reference to the accompanying drawings.

Referring to the drawings:

FIGURE 1 is a schematic circuit diagram of a step recovery diode in accordance with the invention; and FIGURE 2 shows the waveform in various parts of the circuit of FIGURE 1.

Referring to FIGURE 1, a step recovery diode 14 is driven by a signal generated by a crystal controlled oscillator circuit 10 including a transistor 12 and a crystal 11. The output of the crystal oscillator is connected to the input of transistor 13 by a transformer T1. The transistor 13 and associated circuitry forms a frequency multiplier circuit which provides a multiplied output frequency.

For example, the oscillator may operate at 50 mc., while the frequency multiplier supplies an output voltage of 150 mc.

The biasing voltages are applied to the transistors through an input collector filter network 21 and an input emitter filter network 22. These filter circuits serve to filter out and prevent any feedback to the associated power supplies from the oscillator circuit.

The output of the multiplier including transistor 13 is applied to the filter network designated generally by the reference numeral 23. This filter network provides a relatively pure output sinewave for application to the step recovery diode 14. The inductance represented at 24 is the lead inductance between the filter circuit 23 and the step recovery diode. There is connected in parallel with the step recovery diode an idler circuit 26 which includes an inductance and a variable capacitance. This idler circuit is adjusted to resonate at one of the harmonics of the output frequency from the filter 23 and serves to idle or store energy at substantially this frequency. The applied frequency is also applied to step recovery diode 14. The diode operates substantially as shown in FIGURE 2A with a conduction of current in the forward direction 26, continued conduction in the reverse direction, 27, until the carriers are depleted, at which time the diode recovers and forms a step as shown at 28. This abrupt change of current generates many harmonics such as shown in FIGURE 2B.

As soon as the step recovery diode is in its "off" condition, the junction acts as a non-linear capacitance with the variation in capacitance dependent upon applied voltage. The applied voltage will be the strong signal appearing at the idler circuit 26 plus all of the harmonic frequencies generated by the step recovery diode. The step recovery diode acts as a frequency converter serving to accept the input frequency from the idler and one or more of the frequencies generated at the abrupt step, and serves to generate a much higher frequency, 2 kmc.

The diode is housed within a resonant section of coaxial transmission line 31 which is tuned to resonate at the desired output frequency. Depending upon the Q of the cavity, the oscillations in the cavity may decay as shown in FIGURE 2C between diode bursts, or if the Q is high enough, there may be continued oscillations within the resonant circuit. An output signal is capacitively coupled from the resonant circuit and applied to a suitable filter network 32. The output of the filter network is the desired output frequency, 2 kmc.

A microwave generator was constructed in accordance with FIGURE 1 in which the various components and voltages were as follows.

Voltages:
- +V—+10 volts
- −V—−10 volts

Transistors:
- 12—S7802
- 13—S7802

Diode:
- 14—HPA0151

Resistors:
- R1—1200Ω
- R2—270Ω
- R3—27Ω
- R4—100Ω
- R5—470Ω

Capacitors:

| | |
|---|---|
| C1—100 μf. | C12—560 pf. |
| C2—.01 μf. | C13—.8–12 pf. |
| C3—330 pf. | C14—15 pf. |
| C4—330 pf. | C15—.8–12 pf. |
| C5—100 μf. | C16—68 pf. |
| C6—330 pf. | C17—330 pf. |
| C7—330 pf. | C18—.01 μf. |
| C8—330 pf. | C19—.8–12 pf. |
| C9—.01 μf. | C20—15 pf. |
| C10—15 pf. | C21—.4–4 pf. |
| C11—.01 μf. | C22—0–2 pf. |

Inductors:

| | |
|---|---|
| L1—1 μh. | L6—3.3 μh. |
| L2—3.3 μh. | L7—3.3 μh. |
| L3—2.7 μh. | L8—0.2 h. |
| L4—2.7 μh. | L9—3.3 μh. |
| L5—1 μh. | L10—0.001–0.003 h. |

The circuit delivered a 20 milliwatt 2 kmc. signal.

I claim:

1. A high frequency generator comprising:
a resonant cavity;
a step recovery diode coupled to excite said cavity;
a resonant circuit tuned to a first frequency coupled to said step recovery diode;
means for exciting said step recovery diode and said resonant circuit with an alternating signal to turn on and off said step recovery diode, said diode generating a signal having high harmonic content as it is turned off; and
mixing means including said diode, coupled to said resonant circuit and to said resonant cavity for mixing said high harmonic content signal and said first frequency signal on said resonant circuit and for exciting said cavity when said diode is off, said cavity being tuned to the algebraic sum of said first frequency and at least one of the harmonics of said high harmonic content signal.

2. A high frequency generator as in claim 1 including means for coupling energy from said resonant cavity and a filter connected to receive and filter the coupled energy.

3. A high frequency generator as in claim 2 wherein said alternating signal is generated by a circuit including a crystal oscillator.

References Cited by the Examiner

UNITED STATES PATENTS 2,982,922 5/1961 Wilson ---------------- 331—76

OTHER REFERENCES

Micronotes, vol. 1, No. 1, May 1963, Published by Microwave Associates, Inc., 7 pages.

ROY LAKE, *Primary Examiner.*

JOHN KOMINSKI, NATHAN KAUFMAN, *Assistant Examiners.*